(12) United States Patent
Tanaka et al.

(10) Patent No.: US 12,557,222 B2
(45) Date of Patent: Feb. 17, 2026

(54) CIRCUIT BOARD, SEMICONDUCTOR DEVICE, AND METHOD OF MANUFACTURING CIRCUIT BOARD

(71) Applicant: SHINKO ELECTRIC INDUSTRIES CO., LTD., Nagano (JP)

(72) Inventors: Hikaru Tanaka, Nagano (JP); Takahiko Kiso, Nagano (JP); Aya Mashima, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 571 days.

(21) Appl. No.: 17/973,750

(22) Filed: Oct. 26, 2022

(65) Prior Publication Data
US 2023/0134246 A1 May 4, 2023

(30) Foreign Application Priority Data
Oct. 29, 2021 (JP) .................................. 2021-178332

(51) Int. Cl.
| | | |
|---|---|---|
| *H05K 3/12* | (2006.01) | |
| *H05K 1/18* | (2006.01) | |
| *H05K 1/181* | (2026.01) | |
| *H05K 3/34* | (2006.01) | |
| *H05K 3/341* | (2026.01) | |

(52) U.S. Cl.
CPC ............ *H05K 3/1258* (2013.01); *H05K 1/181* (2013.01); *H05K 3/3431* (2013.01); *H05K 2203/0465* (2013.01)

(58) Field of Classification Search
CPC ......... H05K 1/181; H05K 2201/09909; H05K 2201/10977; H05K 2203/0465; H05K 3/1258; H05K 3/3431
See application file for complete search history.

(56) References Cited

U.S. PATENT DOCUMENTS

| | | | |
|---|---|---|---|
| 9,728,425 B1* | 8/2017 | Heppner | H01L 21/67126 |
| 2008/0179738 A1* | 7/2008 | Nishimura | H01L 25/0655 |
| | | | 257/737 |
| 2009/0154128 A1 | 6/2009 | Tamadate | |

(Continued)

FOREIGN PATENT DOCUMENTS

| | | |
|---|---|---|
| JP | 2009-010073 | 1/2009 |
| JP | 2009-147007 A | 7/2009 |

(Continued)

OTHER PUBLICATIONS

Japanese Office Action dated Mar. 11, 2025 issued in corresponding Japanese application No. 2021-178332; English translation included (10 pages).

*Primary Examiner* — Timothy J Thompson
*Assistant Examiner* — Rhadames Alonzo Miller
(74) *Attorney, Agent, or Firm* — Rankin, Hill & Clark LLP (57) ABSTRACT

A circuit board includes an insulating layer that is layered on a substrate; and a dam member in a form of a rectangular frame that is formed on the insulating layer. A corner part of the dam member includes a slope that slopes down from an inner wall surface to a surface of the insulating layer in a lower part that makes contact with the surface of the insulating layer; and a perpendicular part that is perpendicular to the surface of the insulating layer in an upper part separated from the surface of the insulating layer.

20 Claims, 13 Drawing Sheets

(56) References Cited

U.S. PATENT DOCUMENTS

| | | | |
|---|---|---|---|
| 2011/0272825 A1* | 11/2011 | McGrath | H01L 25/0657 |
| | | | 257/E21.503 |
| 2011/0316170 A1 | 12/2011 | Muramatsu et al. | |
| 2014/0284081 A1 | 9/2014 | Nishida et al. | |
| 2015/0216059 A1 | 7/2015 | Hayashi et al. | |
| 2016/0365258 A1* | 12/2016 | Munding | H01L 24/83 |
| 2017/0103906 A1* | 4/2017 | Han | H01L 21/563 |
| 2019/0067141 A1* | 2/2019 | Fu | H01L 23/315 |
| 2019/0326234 A1* | 10/2019 | Benson | H01L 23/13 |
| 2020/0003975 A1* | 1/2020 | Yu | G02B 6/4255 |
| 2020/0066653 A1* | 2/2020 | Kamphuis | H01L 24/85 |
| 2021/0066151 A1* | 3/2021 | Hu | H01L 23/10 |
| 2021/0082891 A1* | 3/2021 | Cha | H01L 21/52 |
| 2021/0242190 A1* | 8/2021 | Oh | H01L 21/565 |
| 2022/0102233 A1* | 3/2022 | Tsai | H01L 21/50 |
| 2022/0301970 A1* | 9/2022 | Kao | H01L 23/49816 |
| 2022/0359476 A1* | 11/2022 | Hu | H01L 23/04 |

FOREIGN PATENT DOCUMENTS

| | | | | |
|---|---|---|---|---|
| JP | 2011-171426 A | | 9/2011 | |
| JP | 2012-9586 A | | 1/2012 | |
| JP | 2014-44979 A | | 3/2014 | |
| JP | 2014044979 A | * | 3/2014 | ............ H01L 24/16 |
| JP | 2014-93512 A | | 5/2014 | |
| JP | 2015-88594 A | | 5/2015 | |
| JP | 2017-157701 | | 9/2017 | |
| JP | 2018-98284 A | | 6/2018 | |
| JP | 2021-129026 A | | 9/2021 | |
| WO | 2014/030309 A1 | | 2/2014 | |

\* cited by examiner

CIRCUIT BOARD, SEMICONDUCTOR DEVICE, AND METHOD OF MANUFACTURING CIRCUIT BOARD

CROSS-REFERENCE TO RELATED APPLICATION

This application is based upon and claims the benefit of priority of the prior Japanese Patent Application No. 2021-178332, filed on Oct. 29, 2021, the entire contents of which are incorporated herein by reference.

FIELD

The embodiment discussed herein is related to a circuit board, a semiconductor device, and a method of manufacturing a circuit board.

BACKGROUND

A semiconductor device is formed, for example, by mounting electronic parts, such as a Si interposer and a die, in a mount area of a circuit board. For example, an encapsulating resin that is referred to as an underfill and that is used to increase connection reliability is poured into an intermediate area between the electronic parts and the mount area, thereby protecting connection terminals that electrically connect the electronic parts and the mount area. When pouring the underfill into the intermediate area, however, a bleeding out in which the underfill flows out of the intermediate area into an area not requiring the underfill sometimes occurs. Thus, a dam member that is formed on a surface of a solder resist layer such that an insulating layer surrounds the mount area in order to avoid the underfill from bleeding out is known.

Patent Literature 1: Japanese Laid-open Patent Publication No. 2009-010073
Patent Literature 2: Japanese Laid-open Patent Publication No. 2017-157701

In a conventional dam member, however, for example, when an angle at which an inner wall surface of each corner part of the dam member is set is a right angle or an acute angle when viewed from a surface of the solder resist layer, the underfill that is poured into the mount area does not reach the corner parts sufficiently and voids occur in the underfill. Furthermore, because of the effect of the shape of the dam member described above, voids tend to remain in the underfill. Furthermore, because of thermal expansion of the voids having occurred, a crack may occur near the solder resist layer or the dam member that is formed of the resin material.

SUMMARY

According to an aspect of an embodiment, a circuit board includes an insulating layer that is layered on a substrate; and a dam member in a form of a rectangular frame that is formed on the insulating layer. A corner part of the dam member includes a slope that slopes down from an inner wall surface to a surface of the insulating layer in a lower part that makes contact with the surface of the insulating layer; and a perpendicular part that is perpendicular to the surface of the insulating layer in an upper part separated from the surface of the insulating layer.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT

With reference to the accompanying drawings, an embodiment of a circuit board, a semiconductor device, and a method of manufacturing a circuit board disclosed herein will be described in detail below. Note that the embodiment does not limit the disclosure.

EMBODIMENT

Figure 1:
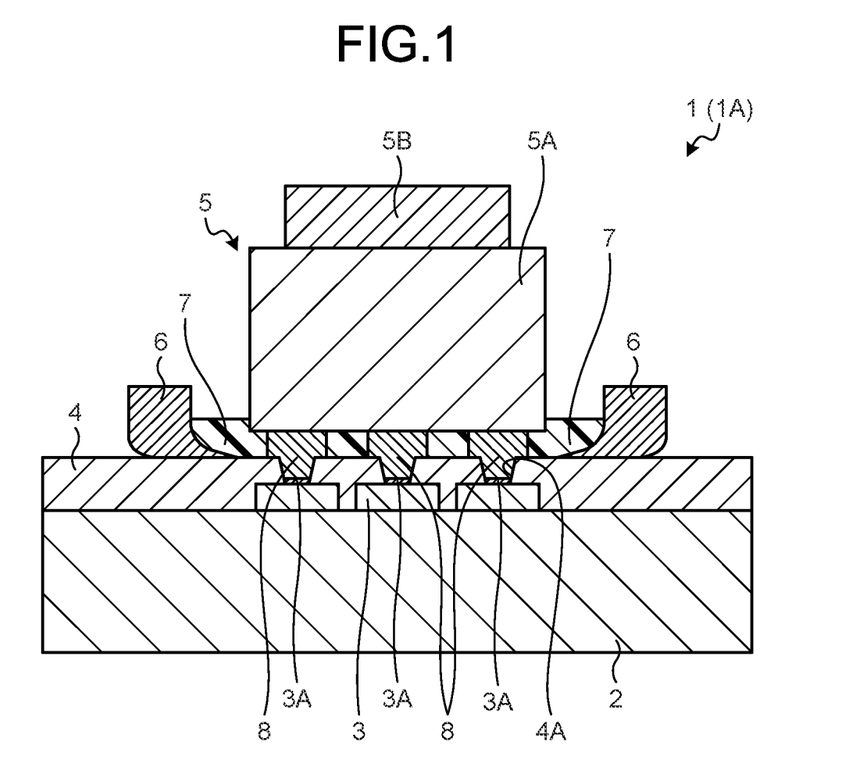
FIG. 1 is an illustration of an example of a semiconductor device of an embodiment.

FIG. 1 is an illustration of an example of a semiconductor device 1A of an embodiment. The semiconductor device 1A illustrated in FIG. 1 includes a circuit board 1 and electronic parts 5. The circuit board 1 is, for example, a build-up board. The circuit board 1 includes a resin substrate 2, a circuit layer 3, a first solder resist (SR) layer 4, and a dam member 6. It is described below that the resin substrate 2 is the lowest layer and the first SR layer 4 is the top layer as illustrated in FIG. 1; however, the circuit board 1 may be used in a vertically-flipped manner or may be used in any posture. Note that the circuit layer 3 is held in a given positon on the resin substrate 2. The resin substrate 2 and the circuit layer 3 are covered with the first SR layer 4.

The first SR layer 4 is a layer that covers the circuit layer 3 that is arranged on the surface of the resin substrate 2 and protects the circuit layer 3. Note that the first SR layer 4 is one type of an insulating layer. An opening 4A is provided in the first SR layer 4 in a mount area 4B in which the electronic parts 5 are mounted and connection bumps 8 electrically connect the circuit layer 3 and the electronic parts 5. The electronic parts 5 include an Si interposer 5A and a die 5B, such as a semiconductor chip, that is mounted on the Si interposer 5A.

Figure 2:
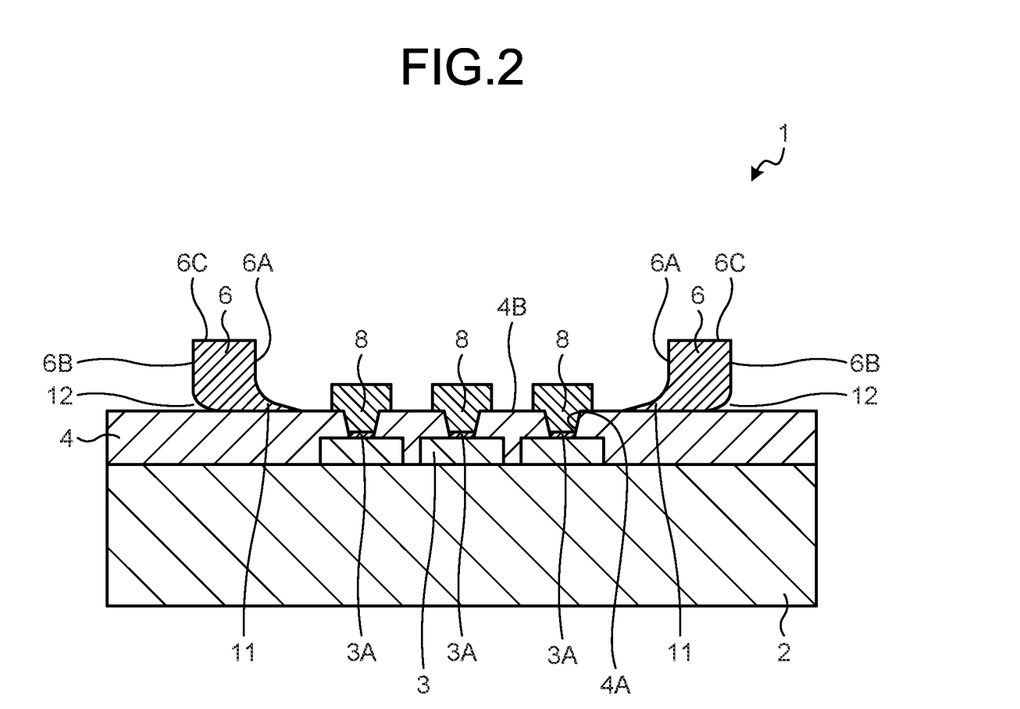
FIG. 2 is an illustration of an example of a dam member in a circuit board.
Figure 3:
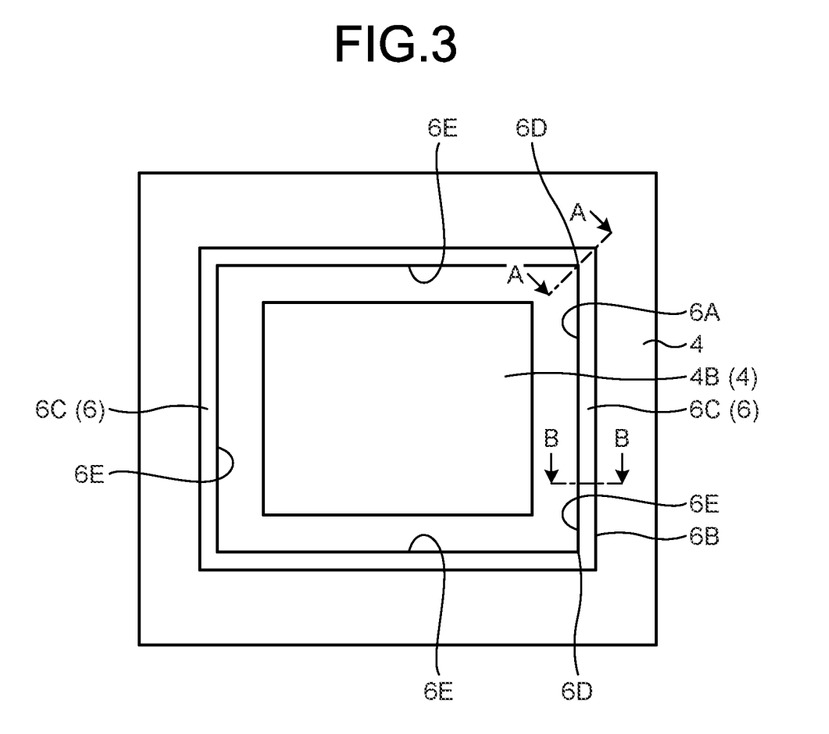
FIG. 3 is a plane schematic view illustrating an example of the dam member.

FIG. 2 is an illustration of an example of a dam member 6 in the circuit board 1 and FIG. 3 is a plane schematic view illustrating an example of the dam member 6. The dam member 6 is a dam member in a form of a rectangular frame that surrounds the rectangular mount area 4B of the first SR layer 4 on which the electronic parts 5 are mounted and that dams an underfill 7 that is supplied to the mount area 4B when the electronic parts 5 are mounted. The dam member 6 includes an inner wall surface 6A that is a wall surface of a dam body on the side of the mount area 4B, an outer wall surface 6B that is a wall surface of the dam body on the side opposite to the mount area 4B, and a top surface 6C of the dam body. The dam member 6 is in a form of a rectangular frame and thus includes straight line parts 6E of four sides and corner parts 6D at four corners.

Figure 4:
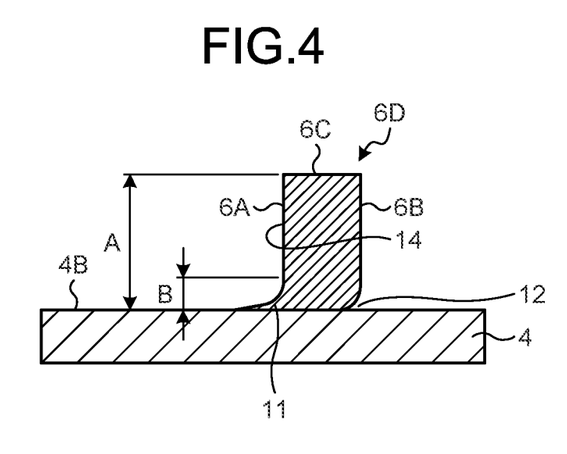
FIG. 4 is a cross-sectional schematic view taken along the line A-A and illustrating an example of a corner part of the dam member.

FIG. 4 is a cross-sectional schematic view t taken along the line A-A and illustrating an example of the corner part 6D of the dam member 6. The inner wall surface 6A of each of the corner parts 6D illustrated in FIG. 4 has a perpendicular part 14 that is perpendicular to a surface of the first SR layer 4 in an upper part separated from the surface of the first SR layer 4 and a slope 11 in a shape of a skirt that slopes down from the inner wall surface 6A toward the mount area 4B to the surface of the first SR layer 4 in a lower part that makes contact with the surface of the first SR layer 4. The slope 11 slopes down from one end of the inner wall surface 6A to the mount area 4B and therefore the underfill 7 that is supplied reaches also the corners of the corner parts 6D. A maximum height dimension B between the slope 11 and the surface of the first SR layer 4 is equal to or smaller than 20% of a maximum height A between the top surface 6C and the surface of the first SR layer 4. An angle at which the slope 11 is set with respect to the surface of the first SR layer 4 is, for example, equal to or smaller than 20 degrees. The height dimension of the perpendicular part 14 is, for example, a difference of (the height dimension A—the height dimension B). The outer wall surface 6B of the corner part 6D has a receding part 12 in an undercut form that is formed in a lower part of the outer wall surface 6B that makes contact with the surface of the first SR layer 4. The receding part 12 recedes inward on the outer wall surface 6B, for example, an encapsulating resin that is supplied when the circuit board 1 is encapsulated thus flows into the receding part 12, and accordingly a sufficient anchor effect is obtained.

Figure 5:
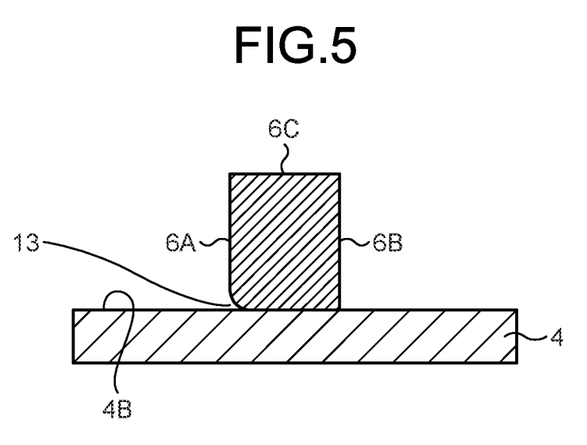
FIG. 5 is a cross-sectional schematic view taken along the line B-B and illustrating an example of a straight line part of the dam member.

FIG. 5 is a cross-sectional schematic view taken along the line B-B and illustrating an example of a straight line part 6E of the dam member 6. The inner wall surface 6A of the straight line part 6E has a receding part 13 in an under-cut form that is formed in a lower part of the inner wall surface 6A that makes contact with the surface of the first SR layer 4. The receding part 13 recedes inward on the inner wall surface 6A, the underfill 7 that is supplied thus flows into the receding part 13, and accordingly a sufficient anchor effect is obtained.

Figure 6:
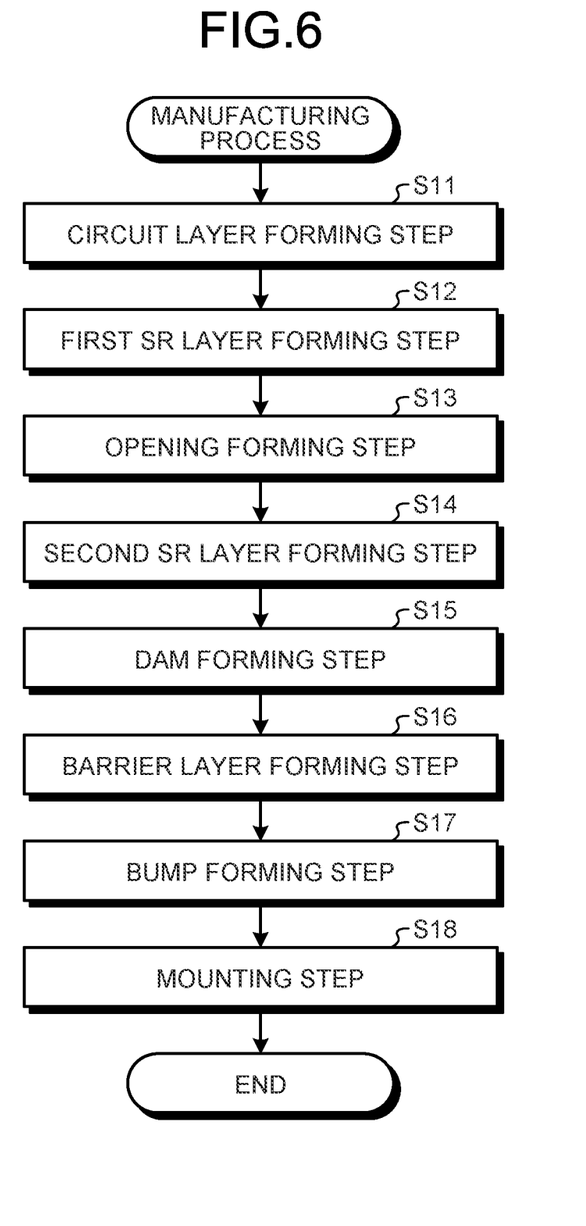
FIG. 6 is a flowchart illustrating an example of a procedure of a process of manufacturing a semiconductor device.

A process of manufacturing the semiconductor device 1A will be described next. FIG. 6 is a flowchart illustrating an example of a procedure of the process of manufacturing the semiconductor device 1A. According to FIG. 6, a circuit layer forming step of forming the circuit layer 3 on the resin substrate 2 is executed as the process of manufacturing the circuit board 1 (step S11). After the circuit layer forming step is executed, a first SR layer forming step of forming the first SR layer 4 on the resin substrate 2 and the circuit layer 3 is executed as the manufacturing process (step S12).

Furthermore, after the first SR forming step is executed, an opening forming step of forming openings 4A in the mount area 4B on the first SR layer 4 is executed as the manufacturing process (step S13). Note that the opening 4A is an opening for forming a via for connection to the circuit layer 3. After the opening forming step is executed, a second SR layer forming step of forming a second SR layer 21 on the first SR layer 4 is executed as the manufacturing process (step S14).

Furthermore, after the second SR layer forming step is executed, a dam forming step of forming the dam member 6 in the second SR layer 21 around the mount area 4B on the first SR layer 4 is executed as the manufacturing process (step S15). After the dam forming step is executed, a barrier layer forming step of forming a barrier layer 3A on the circuit layer 3 that is exposed from the opening 4A of the first SR layer 4 is executed as the manufacturing process (step S16).

After the barrier layer forming step is executed, a bump forming step of forming the connection bumps 8 on the barrier layer 3A in the openings 4A of the first SR layer 4 is executed as the manufacturing process (step S17). Furthermore, after the bump forming step is executed, the electronic parts 5 are mounted on the connection bumps 8 in the mount area 4B and the underfill 7 is poured into the mount area 4B as the manufacturing process. By pouring the underfill 7, a mounting step of mounting the electronic parts 5 in the mount area 4B of the first SR layer 4 is executed (step S18). Note that, even when the underfill 7 is poured into the mount area 4B, the underfill 7 reaches the corner parts 6D because of the slopes 11 of the corner parts 6D in the dam member 6 and thus it is possible to prevent bleeding out while inhibiting occurrence of voids.

Figure 7:
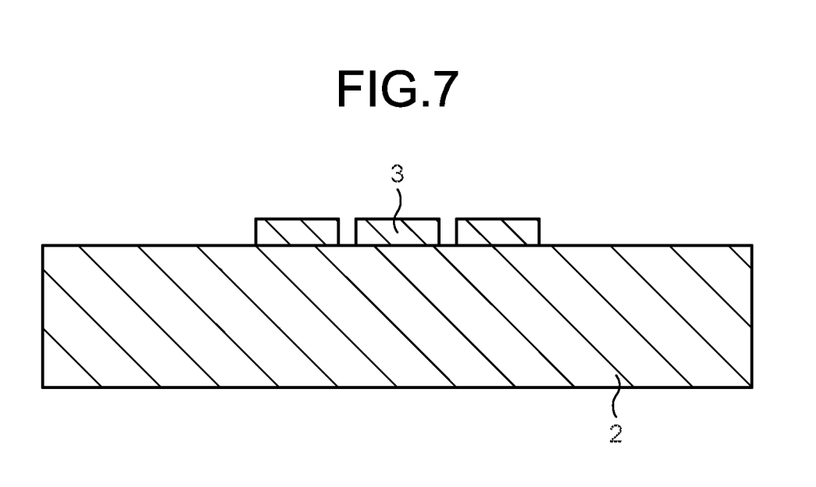
FIG. 7 is an illustration of an example of a circuit layer forming step.

FIG. 7 is an illustration of an example of the circuit layer forming step. At the circuit layer forming step of step S11, as illustrated in FIG. 7, for example, the circuit layer 3 is formed on the resin substrate 2. Specifically, a photosensitive resin layer is formed on the resin substrate 2 and exposure and development is performed. Accordingly, a plating resist pattern is formed on the resin substrate 2. Furthermore, by executing electrolyte copper plating on the resin substrate 2 after formation of the plating resist pattern, a copper plating layer is formed on the resin substrate 2 that is exposed from the plating resist pattern. Removing the plating resist pattern from the resin substrate 2 forms, for example, the circuit layer 3 on the resin substrate 2.

Figure 8:
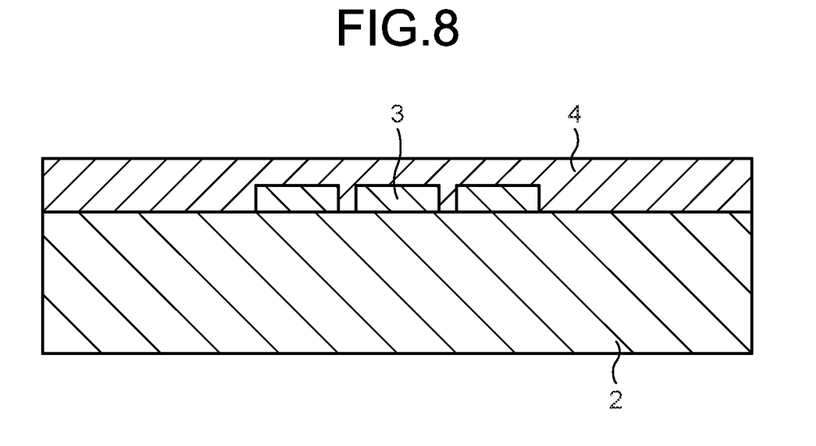
FIG. 8 is an illustration of an example of a first SR forming step.

FIG. 8 is an illustration of an example of the first SR forming step. In the first SR forming step at step S12, as illustrated in FIG. 8, the first SR layer 4 is formed on the resin substrate 2 on which the circuit layer 3 is formed. Specifically, for example, insulating photosensitive resin, such as acrylic resin or polyimide resin, is laminated and is layered on the resin substrate 2, so that the first SR layer 4 is formed on the resin substrate 2. A thickness dimension of the first SR layer 4 is, for example, within a range of 10 to 30 μm. Note that, although the insulating photosensitive resin is exemplified, the first SR layer 4 may be formed using, for example, insulating non-photosensitive resin, such as epoxy resin.

Figure 9:
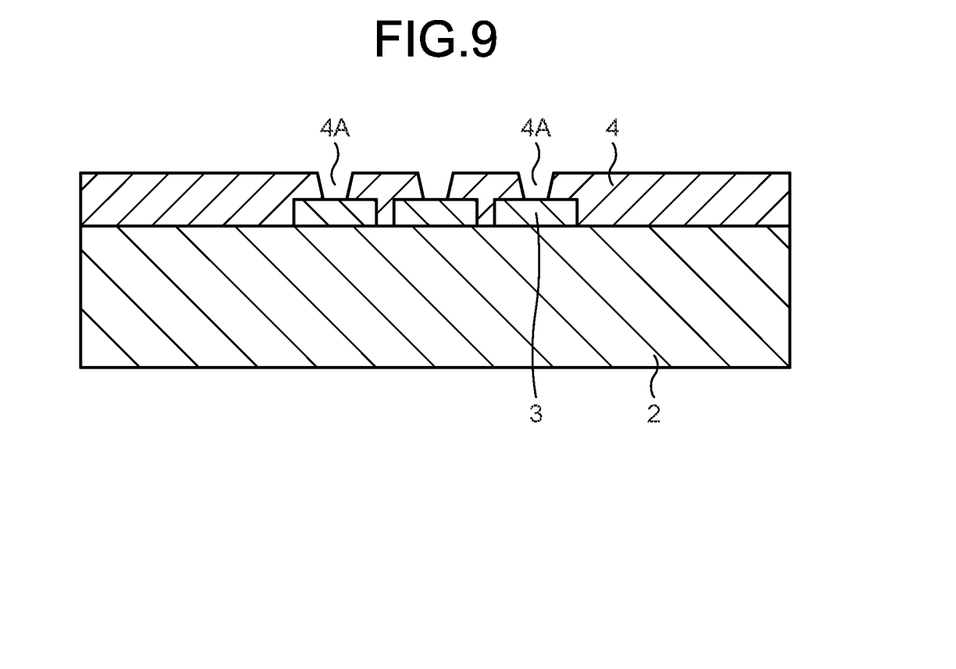
FIG. 9 is an illustration of an example of an opening forming step.

FIG. 9 is an illustration of an example of the opening forming step. At the opening forming step of step S13, as illustrated in FIG. 9, the openings 4A are formed in the first SR layer 4. Specifically, for example, after the acrylic resin or polyimide resin is cured, the openings 4A are formed in given positions on the first SR layer 4 by laser processing or photolithography. The openings 4A that are formed on the first SR layer 4 expose part of the circuit layer 3 under the openings 4A. Note that the opening dimension of the opening 4A is, for example, within a range of 10 to 100 μm.

Figure 10:
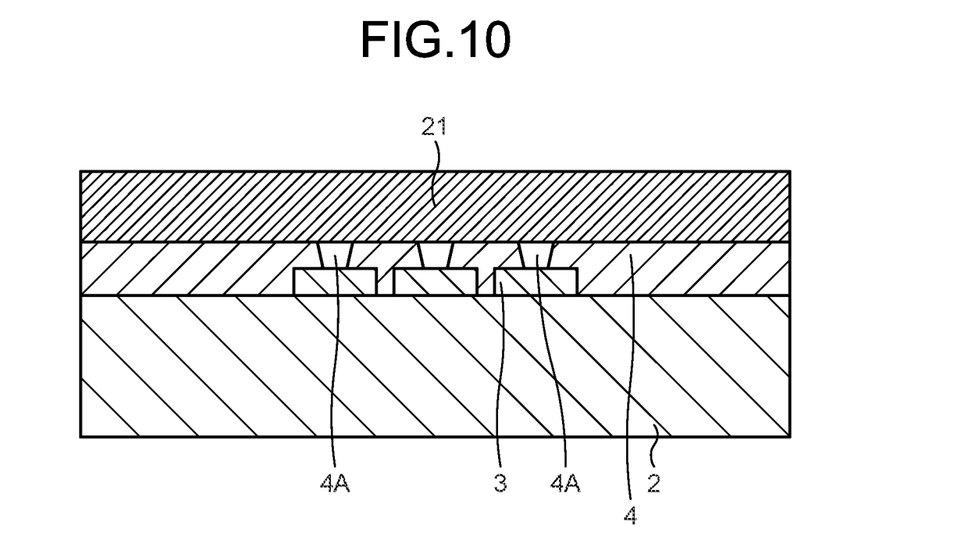
FIG. 10 is an illustration of an example of a second SR forming step.

FIG. 10 is an illustration of an example of the second SR forming step on the circuit board 1. At the second SR forming step of step S14, as illustrated in FIG. 10, the second SR layer 21 is formed on the first SR layer 4 in which the openings 4A are formed. Specifically, for example, insulating photosensitive resin, such as acrylic resin or polyimide resin, is laminated and layered on the first SR layer 4, so that the second SR layer 21 is formed on the first SR layer 4. The thickness dimension of the second SR layer 21 is, for example, within a range of 10 to 30 μm. Note that the second SR layer 21 may be formed using an insulating non-photosensitive resin, such as epoxy resin.

Figure 11:
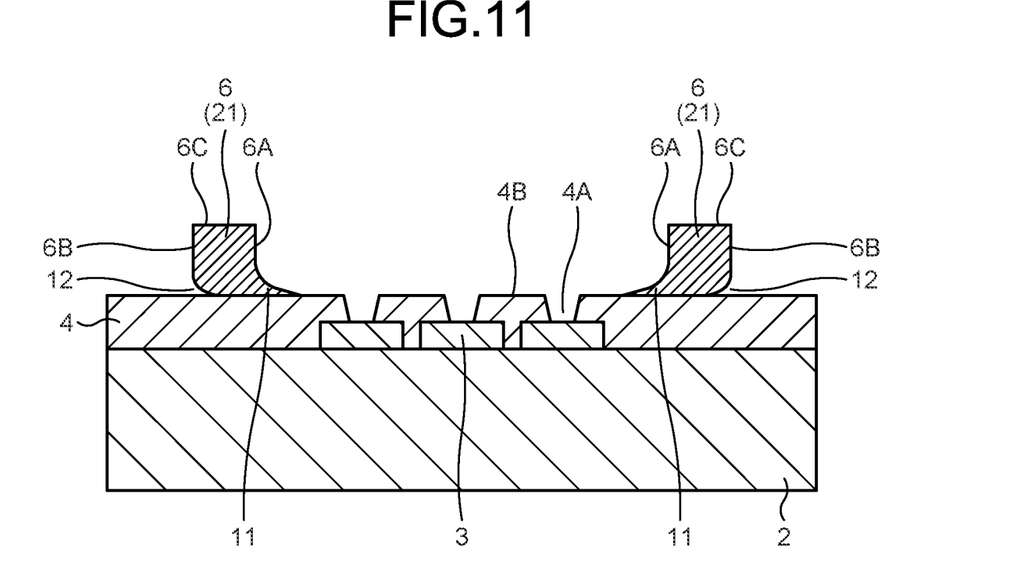
FIG. 11 is an illustration of an example of a dam forming step.

FIG. 11 is an illustration of an example of the dam forming step. As illustrated in FIG. 11, using the second SR layer 21, the dam member 6 is formed on the first SR layer 4 such that the dam member 6 surrounds the mount area 4B in the first SR layer 4. Specifically, for example, the dam member 6 is formed on the first SR layer 4 using the second SR layer 21 through exposure, development, and the process of curing the acrylic resin. The slope 11 is formed on the inner wall surface 6A of the corner part 6D by making an adjustment such that a first exposure on the inner wall surface 6A of the corner part 6D of the dam member 6 is larger than a second exposure on the straight line part 6E and making an exposure by the first exposure. The receding part 12 is formed in the lower part of the outer wall surface 6B by making an adjustment such that the second exposure on the outer wall surface 6B of the corner part 6D is lower than the first exposure and making an exposure by the second exposure. As a result, the slope 11 that is a downslope at a slope angle within 20 degrees with respect to the surface of the first SR layer 4 is formed on the inner wall surface 6A of the dam member 6. Note that the width dimension of the top surface 6C of the dam member 6 is, for example, 100 to 1000 μm, the length dimension of the slope 11 is, for example, 30 μm or smaller, and the depth dimension (undercut length) of the receding part 12 is, for example, 30 μm or smaller. The distance dimension from the end of the mount area 4B to the slope 11 is, for example, within the range of 50 μm to 5 mm.

Figure 12:
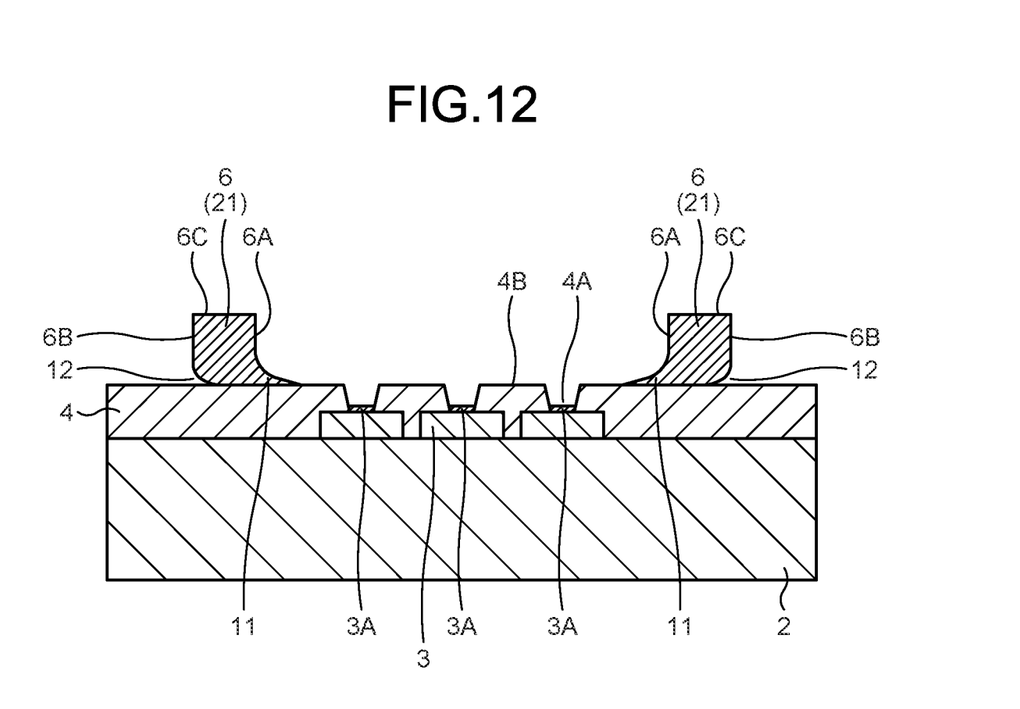
FIG. 12 is an illustration of an example of a barrier layer forming step.

FIG. 12 is an illustration of an example of the barrier layer forming step. At the barrier layer forming step of step S16, as illustrated in FIG. 12, the barrier layer 3A is formed on the circuit layer 3 that is exposed in each of the openings 4A in the mount area 4B. Specifically, the barrier layer 3A is formed by forming an organic film for preventing oxidation, electroless NiPdAu plating, or the like.

Figure 13:
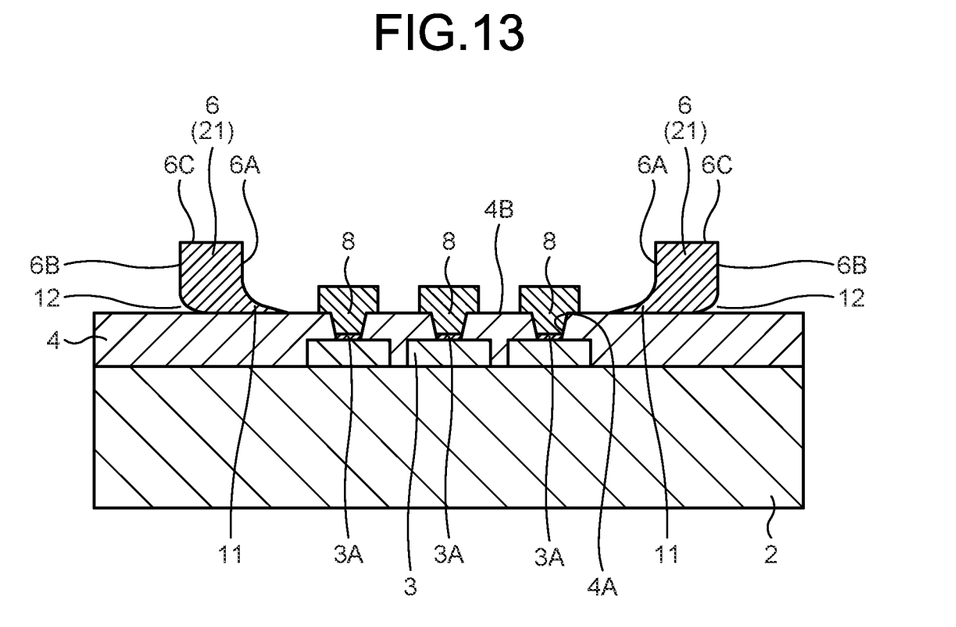
FIG. 13 is an illustration of an example of a bump forming step.

FIG. 13 is an illustration of an example of the bump forming step. At the bump forming step of step S17, after the barrier layer forming step is executed, as illustrated in FIG. 13, the connection bumps 8 are formed in the openings 4A in the first SR layer 4. Note that the connection bumps 8 are formed by the same manufacturing method as the method of manufacturing the circuit layer 3.

Figure 14:
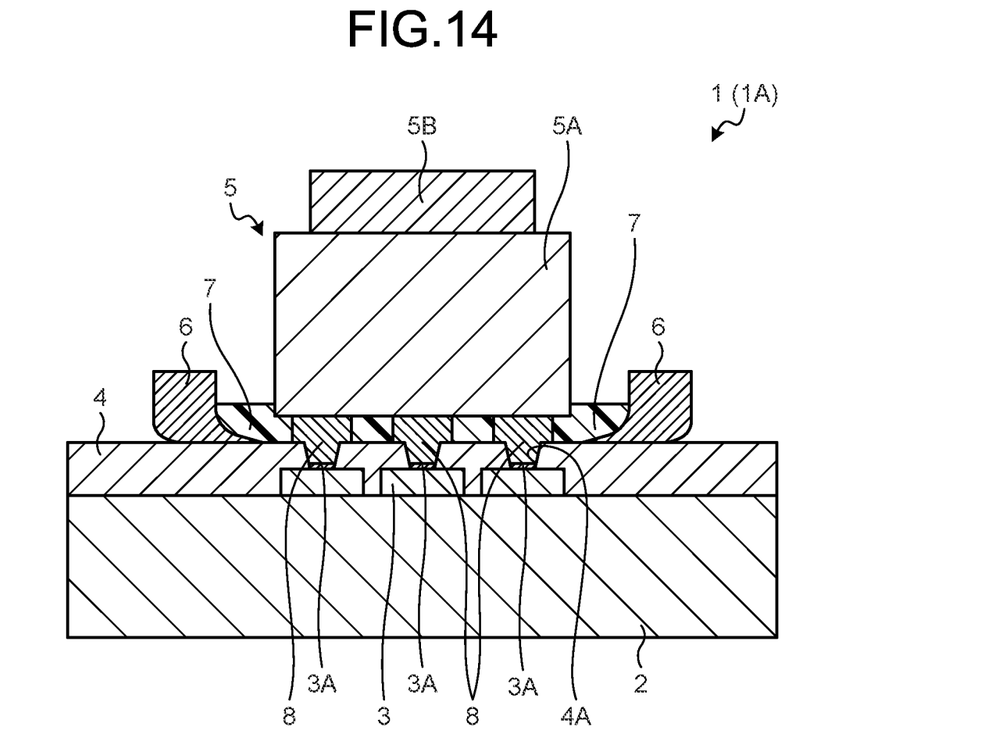
FIG. 14 is an illustration of an example of a mounting step.

FIG. 14 is an illustration of an example of the mounting step. The semiconductor device 1A is configured by mounting the electronic parts 5 on the circuit board 1 illustrated in FIG. 14. The electrodes on the bottom surface of the electronic parts 5 are joined to the connection bumps 8 by solder, or the like. Furthermore, the joints between the electrodes of the electronic parts 5 in the mount area 4B and the connection bumps 8 on the circuit board 1 are encapsulated by the underfill 7, so that the electronic parts 5 are mounted on the circuit board 1. Even when the underfill 7 is poured into the mount area 4B, the dam member 6 dams the underfill 7. Pouring the underfill 7 into the intermediate area between the mount area 4B and the Si interposer 5A enables protection of the connection bumps 8. The underfill 7 reaches the corner parts 4D sufficiently because of presence of the slopes 11 in the corner parts 6D of the dam member 6 and therefore occurrence of voids can be inhibited. Note that the underfill material used herein is normal liquid thermoset resin (epoxy resin is the base resin).

Figure 15:
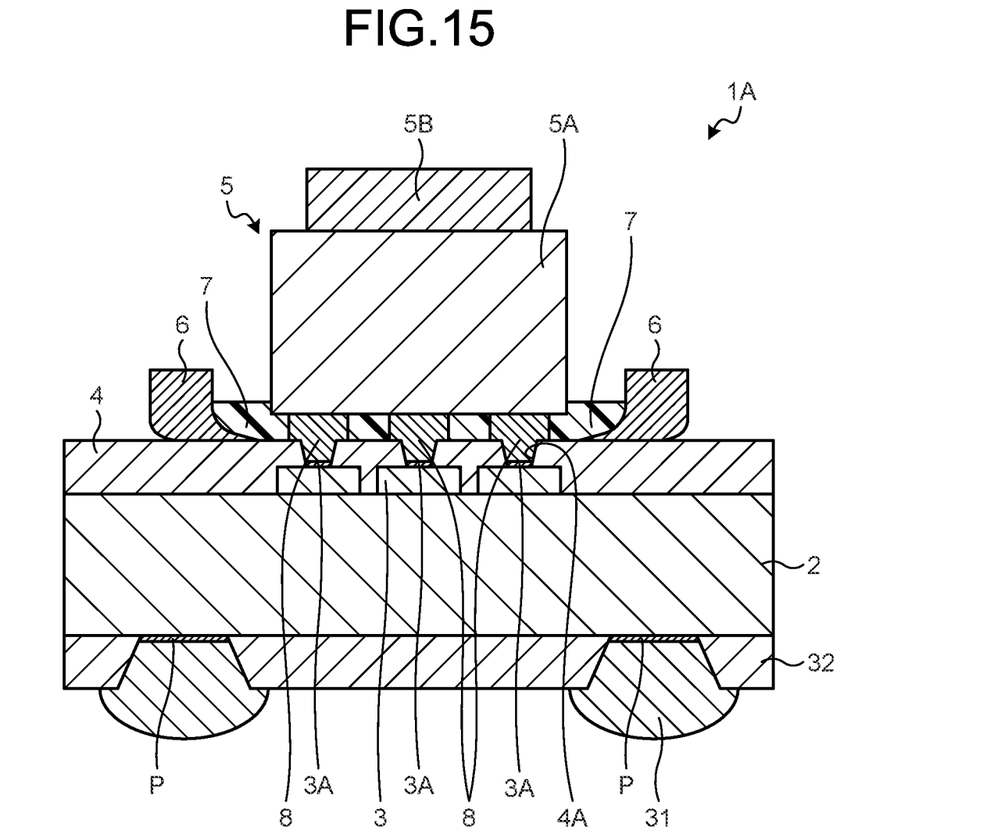
FIG. 15 is an illustration of an example of a semiconductor device.

FIG. 15 is an illustration of an example of the semiconductor device 1A. It is a configuration in which external connection terminals 31 and an insulating layer 32 are provided on pads P on the side of a bottom surface of the resin substrate 2 in a lower part of the semiconductor device 1A illustrated in FIG. 14. The semiconductor device 1A illustrated in FIG. 15 is formed in a way that the insulating layer 32 is formed by layering on the side of the bottom surface of the resin substrate 2 at the same timing as that at which the first SR layer 4 is formed, openings are provided in the insulating layer 32 such that the pads P on the side of the bottom surface of the resin substrate 2 are exposed, and the external connection terminals 31 are formed using solder balls, or the like.

Figure 16:
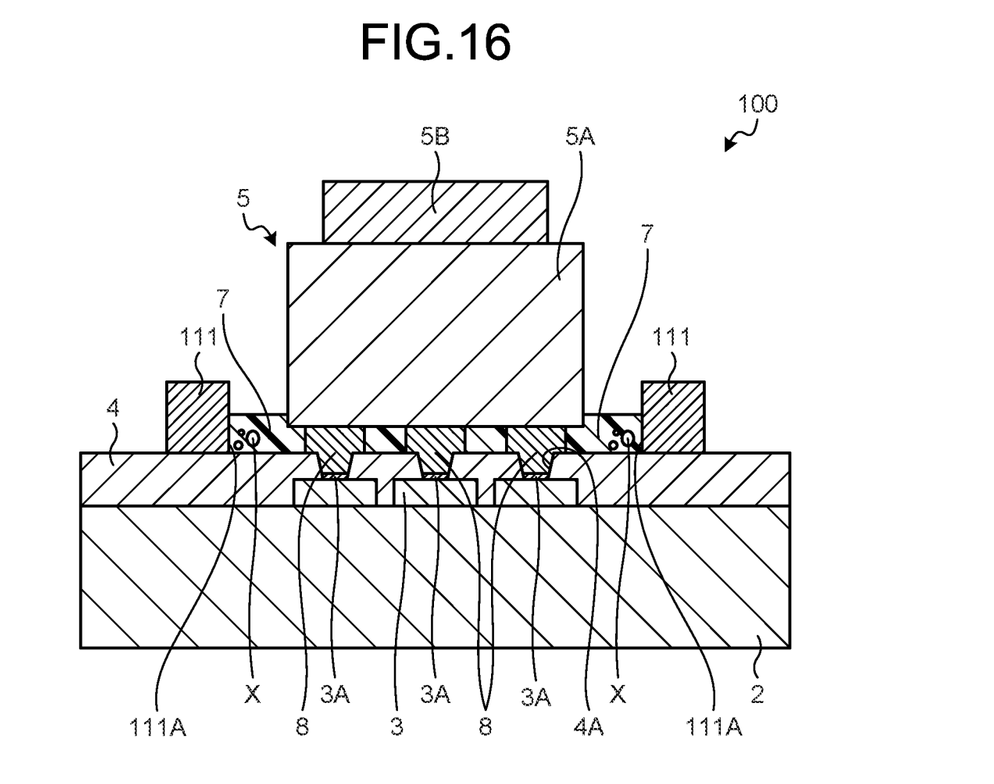
FIG. 16 is an illustration of an example of a semiconductor device of a comparative example.

FIG. 16 is an illustration of an example of a semiconductor device 100 of a comparative example. Note that a circuit board of the semiconductor device 100 of the comparative example is different from the circuit board 1 of the semiconductor device 1A of the embodiment in that, for example, the angle at which an inner wall surface 111A of a corner part of a dam member 111 with respect to the surface of the first SR layer 4 is a right angle. In the circuit board of the semiconductor device 100 of the comparative example illustrated in FIG. 16, voids X may occur because the angle at which the inner wall surface 111A is set with respect to the surface of the first SR layer 4 is a right angle and thus the underfill 7 would not reach the corner parts of the inner wall surface 111A. On the other hand, the circuit board 1 of the embodiment has the slope 11 that slopes down from the inner wall surface 6A of the corner part 6D of the dam member 6 surrounding the mount area 4B to the surface of the first SR layer 4. As a result, the underfill 7 sufficiently reaches the corner parts 6D of the inner wall surface 6A and thus occurrence of voids X can be prevented.

Figure 17:
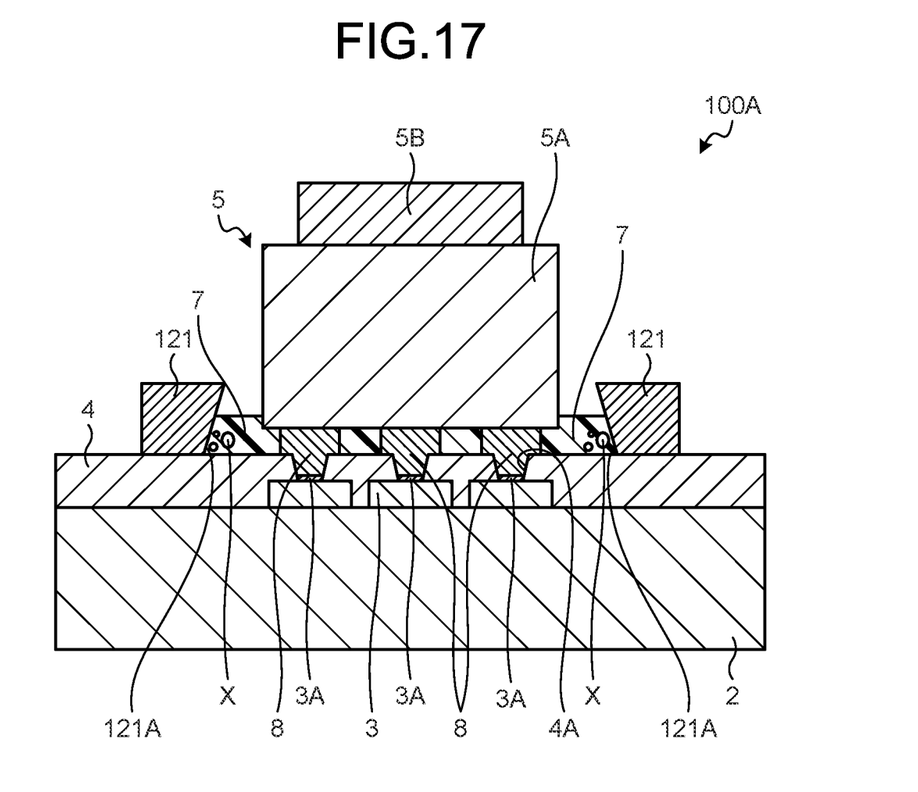
FIG. 17 is an illustration of an example of a semiconductor device of a comparative example.

FIG. 17 is an illustration of a semiconductor device 100A of a comparative example. Note that a circuit board of the semiconductor device 100A of the comparative example is different from the circuit board 1 of the semiconductor device 1A of the embodiment in that, for example, the angle at which an inner wall surface 121A of a corner part of a dam member 121 with respect to the surface of the first SR layer 4 is an acute angle. In the circuit board of the semiconductor device 100A of the comparative example illustrated in FIG. 17, voids X may occur because the angle at which the inner wall surface 121A is set with respect to the surface of the first SR layer 4 is an acute angle and thus the underfill 7 would not reach the corner parts of the inner wall surface 121A. On the other hand, the circuit board 1 of the embodiment has the slope 11 that slopes down from the inner wall surface 6A of the corner part 6D of the dam member 6 surrounding the mount area 4B to the surface of the first SR layer 4. As a result, the underfill 7 sufficiently reaches the corner parts 6D of the inner wall surface 6A and thus occurrence of voids X can be prevented.

Also when the dam member surrounding the mount area is tapered with the angle at which the inner wall surface is set exceeding 90 degrees when viewed from the mount area, voids X may occur because the underfill would not reach the corner part of the inner wall surface of the dam member. On the other hand, the circuit board 1 of the embodiment has the slope 11 that slopes down from the inner wall surface 6A of the corner part 6D of the dam member 6 surrounding the mount area 4B to the surface of the first SR layer 4. As a result, the underfill 7 sufficiently reaches the corner parts 6D of the inner wall surface 6A and thus occurrence of voids X can be prevented.

In the circuit board 1 of the present embodiment, the inner wall surface 6A of each corner part 6D of the dam member 6 has the slope 11 sloping down from the inner wall surface 6A toward the mount area 4B to the surface of the first SR layer 4. Forming the slopes 11 on the inner wall surface 6A of the corner parts 6D causes the underfill 7 that is poured into the mount area 4B to reach each corner part 6D along the slope 11. As a result, occurrence of voids X can be inhibited.

The inner wall surface 6A of the straight line part 6E of the dam member 6 has the receding part 13 that is formed in the lower part of the inner wall surface 6A that makes contact with the surface of the first SR layer 4. As a result, the underfill 7 that is supplied flows into the receding part 13 and thus a sufficient anchor effect is obtained. Moreover, bubbles that occur flow into the corner parts 6D and this reduces the concern about remaining of voids X.

The outer wall surface 6B of each corner part 6D of the dam member 6 has the receding part 12 that is formed in the lower part of the outer wall surface 6B that makes contact with the surface of the first SR layer 4. As a result, the encapsulating resin that is supplied to encapsulate the circuit board 1 flows into the receding part 12 and thus a sufficient anchor effect is obtained.

The maximum height dimension B between the slope 11 and the surface of the first SR layer 4 is equal to or smaller than 20% of the maximum height A between the top surface 6C of the dam member 6 and the surface of the first SR layer 4. As a result, it is possible to form the slope 11 that is a downslope from the inner wall surface 6A to the surface of the first SR layer 4 such that the underfill 7 reaches the inside of the corner part 6D.

The dam member 6 is formed of the same material as that of the first SR layer 4. As a result, the binding force between the dam member 6 and the first SR layer 4 is increased and thus it is possible to inhibit occurrence of cracks between the first SR layer 4 and the dam member 6.

The lower part of the inner wall surface 6A of the dam member 6 is the slope 11 that is curved and therefore the air comes out easier than in the case where the inner wall surface 6A is straight or has an inverse tapered shape. In other words, reducing the angle at which the inner wall surface 6A of the dam member 6 is set with respect to the surface of the first SR layer 4 as according to the present application causes the air to go out easily and increases, which increases the effect of inhibiting voids X.

In the dam forming step of forming the dam member 6, the inner wall surface 6A and the outer wall surface 6B are formed using the second SR layer 21. Furthermore, in the dam forming step, using the second SR layer 21, the slope 11 that slopes down from the inner wall surface 6A of each corner part 6D of the dam member 6 toward the mount area 4B to the surface of the first SR layer 4 is formed on the inner wall surface 6A of each corner part 6D. As a result, it is possible to increase the binding force between the dam member 6 and the surface of the first SR layer 4 using the second SR layer 21 of which material is the same as that of the first SR layer 4.

In the dam forming step, the slope 11 is formed by the first exposure on the inner wall surface 6A of the corner part 6D and the receding part 12 is formed in the lower part of the outer wall surface 6B making contact with the first SR layer 4 by the second exposure smaller than the first exposure on the outer wall surface 6B. Changing the exposure enables formation of the slope 11 and the receding part 12.

It is necessary to provide a margin between the openings 4A in the mount area 4B on which the electronic parts 5 are mounted and the dam member 6; however, tapering both the inner wall surface and the outer wall surface of the dam member narrows the margin between the openings 4A and the dam member, which limits the design. On the other hand, the dam member 6 of the embodiment has the configuration in which only the corner parts 6D are provided with the slopes 11 and thus a margin between the openings 4A and the dam member 6 is ensured, which reduces the limitation on the design.

For convenience of description, the case where the dam member 6 is formed of the SR material is illustrated; however, for example, there are also a coverlay material (an adherent film member) or a liquid insulating material (a material with a high viscosity). A material with openings that are formed by punching may be positioned on and attached to the substrate as the coverlay material. The liquid insulating material may be applied and formed into a shape of a dam with a width/height of few hundreds mm to few mm. When the dam member 6 is formed of the SR material, positioning accuracy of positioning the slopes 11 is high, which increases dimensional accuracy of the dam member 6.

The configuration in which the inner wall surface 6A of each corner part 6D has the slope 11 is exemplified as the dam member 6; however, the inner wall surface 6A of every corner part 6D need not necessarily have the slope 11. For example, depending on the direction and flow in which the underfill 7 is injected, the presence of the slope 11 on the inner wall surface 6A of at least one corner part 6D makes it possible to inhibit voids X in the underfill 7.

The case where the Si interposer 5A and the die 5B are included as the electronic parts 5 is exemplified; however, the die 5B may be mounted in the mount area 4B and changes can be made as appropriate.

In one embodiment as described above, a method of manufacturing a circuit board, the method includes:
  forming a first solder resist layer on a substrate;
  forming a second solder resist layer on the first solder resist layer; and
  forming a dam member in a form of a rectangular frame by performing exposure and development on the second resist layer,
  wherein the forming the dam member includes forming a slope that slopes down from an inner wall surface of a corner part of the dam member to a surface of the first solder resist layer by
  exposing the inner wall surface of the corner part of the dam member by a first exposure, and
  exposing an outer wall surface of the corner part of the dam member by a second exposure smaller than the first exposure.

According to a mode of the circuit board disclosed herein, for example, because the underfill that is poured into the mount area reaches the corner parts along the slopes, it is possible to inhibit occurrence of voids X.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A circuit board comprising:
a substrate including a circuit layer;
an insulating layer that covers the circuit layer and is layered on the substrate;
a connection bump that penetrates the insulating layer and is formed on the circuit layer; and
a dam member in a form of a rectangular frame that is formed on the insulating layer and is arranged around the connection bump;
wherein a corner part of the dam member includes
a slope that slopes down from an inner wall surface to a surface of the insulating layer in a lower part that makes contact with the surface of the insulating layer;
a perpendicular part that is perpendicular to the surface of the insulating layer in an upper part separated from the surface of the insulating layer; and
a receding part that is formed on an outer wall surface of the corner part and recedes in a lower part of the outer wall surface that makes contact with the surface of the insulating layer.

2. The circuit board according to claim 1, further including an inner wall surface receding part that is formed in an inner wall surface of a straight line part of the dam member and that recedes in a lower part of the inner wall surface that makes contact with the surface of the insulating layer.

3. The circuit board according to claim 1, wherein a maximum height dimension between the slope and the insulating layer is equal to or smaller than 20% of a maximum height dimension between a top surface of the dam member and the insulating layer.

4. The circuit board according to claim 1, wherein the dam member is formed of the same material as that of the insulating layer.

5. The circuit board according to claim 1, wherein the connection bump is connected to the circuit layer.

6. The circuit board according to claim 1, wherein the slope slopes down curvedly toward the surface of the insulating layer.

7. The circuit board according to claim 1, wherein the receding part is a groove in an undercut form that recedes inward and curvedly on the outer wall surface of the corner part.

8. The circuit board according to claim 1, wherein the slope slopes down from the inner wall surface to the surface of the insulating layer while protruding from the inner wall surface.

9. The circuit board according to claim 1, wherein the outer wall surface of the corner part is opposite to the inner wall surface of the corner.

10. The circuit board according to claim 9, wherein the slope slopes down curvedly toward the surface of the insulating layer.

11. The circuit board according to claim 9, wherein the receding part is a groove in an undercut form that recedes inward and curvedly on the outer wall surface of the corner part.

12. The circuit board according to claim 9, wherein the slope slopes down from the inner wall surface to the surface of the insulating layer while protruding from the inner wall surface.

13. A semiconductor device comprising:
a substrate including a circuit layer;
an insulating layer that covers the circuit layer and that is layered on the substrate;
a connection bump that penetrates the insulating layer and that is formed on the circuit layer;
an electronic part that is placed such that the electronic part is electrically connected to the connection bump;
a dam member in a form of a rectangular frame that is arranged around a mount area in which the electronic part is placed; and
an underfill that is supplied to the mount area,
wherein a corner part of the dam member includes
a slope that slopes down from an inner wall surface to a surface of the insulating layer in a lower part that makes contact with the surface of the insulating layer;
a perpendicular part that is perpendicular to the surface of the insulating layer in an upper part separated from the surface of the insulating layer; and
a receding part that is formed on an outer wall surface of the corner part and recedes in a lower part of the outer wall surface that makes contact with the surface of the insulating layer.

14. The semiconductor device according to claim 13, wherein the slope slopes down curvedly toward the surface of the insulating layer.

15. The semiconductor device according to claim 13, wherein the receding part is a groove in an undercut form that recedes inward and curvedly on the outer wall surface of the corner part.

16. The semiconductor device according to claim 13, wherein the slope slopes down from the inner wall surface to the surface of the insulating layer while protruding from the inner wall surface.

17. The semiconductor device according to claim 13, wherein the outer wall surface of the corner part is opposite to the inner wall surface of the corner.

18. The semiconductor device according to claim 17, wherein the slope slopes down curvedly toward the surface of the insulating layer.

19. The semiconductor device according to claim 17, wherein the receding part is a groove in an undercut form that recedes inward and curvedly on the outer wall surface of the corner part.

20. The semiconductor device according to claim 17, wherein the slope slopes down from the inner wall surface to the surface of the insulating layer while protruding from the inner wall surface.

* * * * *